(12) United States Patent
Caffee et al.

(10) Patent No.: US 10,637,483 B2
(45) Date of Patent: Apr. 28, 2020

(54) NEUTRALIZATION OF PHASE PERTURBATIONS FROM DETERMINISTIC ELECTROMAGNETIC INTERFERENCE

(71) Applicant: Silicon Laboratories Inc., Austin, TX (US)

(72) Inventors: Aaron J. Caffee, Scappoose, OR (US); Russell Croman, Buda, TX (US); Brian G. Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/944,567

(22) Filed: Apr. 3, 2018

(65) Prior Publication Data

US 2019/0305783 A1    Oct. 3, 2019

(51) Int. Cl.
| | | |
|---|---|---|
| *G06F 1/04* | (2006.01) | |
| *H03L 7/093* | (2006.01) | |
| *H04L 7/033* | (2006.01) | |
| *H05K 1/02* | (2006.01) | |
| *H03L 7/091* | (2006.01) | |
| *H03L 7/087* | (2006.01) | |

(52) U.S. Cl.
CPC .............. *H03L 7/093* (2013.01); *H03L 7/087* (2013.01); *H03L 7/091* (2013.01); *H04L 7/033* (2013.01); *H05K 1/0216* (2013.01)

(58) Field of Classification Search
CPC ......... H03L 7/093; H03L 7/087; H03L 7/091; H03L 7/033; H03K 5/132; H03K 5/135; H03K 7/093; H05K 1/0216; G06F 1/04; G06F 1/06; G06F 1/08; G06F 1/10
See application file for complete search history.

(56) References Cited

U.S. PATENT DOCUMENTS

| | | |
|---|---|---|
| 6,831,523 B1 | 12/2004 | Pastorello et al. |
| 7,199,650 B1 | 4/2007 | Welland et al. |
| 7,375,591 B2 | 5/2008 | Fu et al. |
| 8,514,118 B2 | 8/2013 | Eldredge |
| 9,473,150 B2 | 10/2016 | Caffee |

(Continued)

OTHER PUBLICATIONS

Hajimiri, A., "A General Theory of Phase Noise in Electrical Oscillators," IEEE Journal of Solid-State Circuits, vol. 33 No. 2, Feb. 1998, pp. 179-194.

(Continued)

*Primary Examiner* — Long Nguyen
(74) *Attorney, Agent, or Firm* — Zagorin Cave LLP

(57) ABSTRACT

A clock generator includes an oscillator configured to generate an oscillating signal and a signal path configured to provide an output clock signal based on the oscillating signal. In response to a control signal, the clock generator is configured to neutralize periodic phase perturbations in the oscillating signal using opposing periodic phase perturbations. The neutralization may occur in the signal path. The signal path may be responsive to the control signal to adjust at least one of a duty cycle, a rise time, and a fall time of the output clock signal to cause alternating phase perturbations of the periodic phase perturbations to apply as the opposing periodic phase perturbations in the output clock signal. The neutralization may occur in the oscillator. The clock generator may include an auxiliary path configured to provide an auxiliary signal to the oscillator.

16 Claims, 8 Drawing Sheets

(56) References Cited

U.S. PATENT DOCUMENTS

| | | | |
|---|---|---|---|
| 9,602,110 B1 | 3/2017 | Caffee | |
| 2014/0312982 A1* | 10/2014 | Yang | H03L 7/24 |
| | | | 331/49 |
| 2015/0145567 A1 | 5/2015 | Perrott | |

OTHER PUBLICATIONS

Niknejad, A., "Injection Locking," EECS 242 Lecture 26, University of California, Berkeley, downloaded from rfic.eecs.berkeley.edu/~niknejad/ee242/pdf/eecs242_lect26_injectionlocking.pdf, Jan. 13, 2017, 45 pages.

Ott, H., "Electromagnetic Compatibility Engineering," John Wiley & Sons Publication, 2009, 862 pages.

Razavi, B., "A Study of Injection Locking and Pulling in Oscillators," IEEE Journal of Solid-State Circuits, vol. 39, No. 3, Sep. 2004, pp. 1415-1424.

Vaucher, C., et al., "A Family of Low-Power Truly Modular Programmable Dividers in Standard 0.35-μm CMOS Technology," IEEE Journal of Solid-State Circuits, vol. 35, No. 7, Jul. 2000, pp. 1039-1045.

\* cited by examiner

NEUTRALIZATION OF PHASE PERTURBATIONS FROM DETERMINISTIC ELECTROMAGNETIC INTERFERENCE

BACKGROUND

Field of the Invention

The present application relates to integrated circuits, and more particularly to integrated circuits that include oscillators.

Description of the Related Art

Driving an oscillating signal off-chip generates a time-varying magnetic field that extends into the surrounding environment. That time-varying magnetic field can inject energy into neighboring circuitry. Injection of energy by an output driver into the oscillator that generates the signal being driven causes a periodic disturbance in the phase trajectory of the oscillator, and introduces spurs in the output signal, thereby reducing performance. For example, spurs (i.e., deterministic jitter) in clock signals used in an exemplary wireless communications system reduce an opening in an eye diagram (i.e., eye pattern) for digital signals at a receiver and degrade performance of the wireless communications system. Spurs generate energy outside of a target frequency band that may affect adjacent channels and may cause energy outside of a frequency band of interest to frequency shift down to an intermediate frequency of the communications system, and thus degrade a signal-to-noise ratio for the communications system. Shielding of the oscillator from the periodic disturbance may be limited by integrated circuit design, manufacturing, and packaging constraints. Accordingly, techniques for reducing or eliminating effects of deterministic electromagnetic interference are desired.

SUMMARY OF EMBODIMENTS OF THE INVENTION

In at least one embodiment of the invention, a clock generator includes an oscillator configured to generate an oscillating signal and a signal path configured to provide an output clock signal based on the oscillating signal. In response to a control signal, the clock generator is configured to neutralize periodic phase perturbations in the oscillating signal using opposing periodic phase perturbations. The neutralization may occur in the signal path. The signal path may be responsive to the control signal to adjust at least one of a duty cycle, a rise time, and a fall time of the output clock signal to cause alternating phase perturbations of the periodic phase perturbations to apply as the opposing periodic phase perturbations in the output clock signal. The neutralization may occur in the oscillator. The clock generator may include an auxiliary path configured to provide an auxiliary signal to the oscillator. The auxiliary signal may be configured according to the control signal to generate a signal having a magnitude equal to a second magnitude of an induced signal in the oscillator and polarity opposite to a second polarity of the induced signal.

In at least one embodiment of the invention, a method for reducing deterministic jitter in an output clock signal of a clock generator includes generating an oscillating signal, providing the output clock signal based on the oscillating signal, and in response to a control signal, neutralizing periodic phase perturbations in the oscillating signal using opposing periodic phase perturbations. The neutralizing may include coupling an auxiliary signal to the oscillator. The auxiliary signal may be based on the output clock signal and a predetermined value corresponding to a magnitude of an induced signal causing the periodic phase perturbations. Providing the output clock signal may include generating the output clock signal having an output frequency that is a first frequency of the oscillating signal divided by a fractional number. The neutralizing may include adjusting a duty cycle of the output clock signal to cause an integer number of periods of the oscillating signal to occur between a rising edge of the output clock signal and a next falling edge of the output clock signal. The neutralizing may include adjusting a duty cycle of the output clock signal in response to the control signal to cause alternating phase perturbations of the periodic phase perturbations to apply opposing phase perturbations to the output clock signal.

In at least one embodiment of the invention, a method for reducing jitter in an output clock signal includes generating the output clock signal having an output frequency that is a first frequency of an oscillating signal divided by a fractional value. The method includes adjusting a duty cycle of the output clock signal to cause an integer number of periods of the oscillating signal to occur between a rising edge of the output clock signal and a falling edge of the output clock signal. The method includes adjusting at least one of a rise time of the rising edge and a fall time of the falling edge to cause the rise time of the output clock signal and the fall time of the output clock signal to provide opposing phase perturbations for a predetermined relationship to the oscillating signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
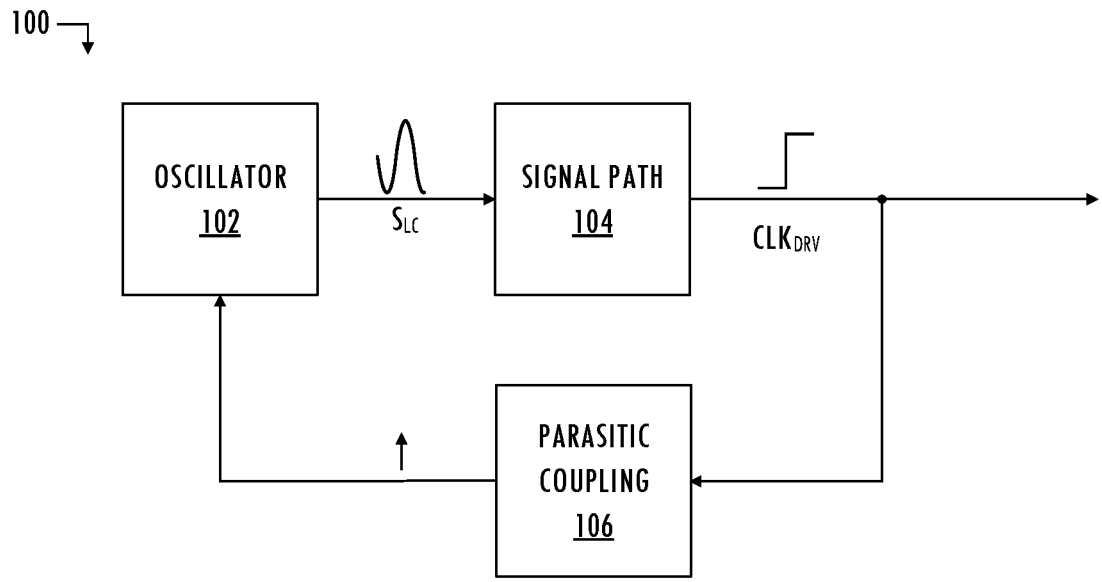
FIG. 1 illustrates a functional block diagram of an exemplary oscillator system.

Referring to FIG. 1, oscillator 102 (e.g., LC oscillator, crystal oscillator, relaxation oscillator, ring oscillator, etc.) is a free-running oscillator that generates oscillating signal $S_{LC}$ having an output voltage that sinusoidally varies at a target frequency (e.g., 1 GHz). Signal path 104 may include a limiting amplifier that senses zero crossings of oscillating signal $S_{LC}$ and generates a square wave, or output clock signal. Output clock signal $CLK_{DRV}$ has a predetermined duty cycle, e.g., a 50% duty cycle that generates a clock edge (e.g., a rising edge or a falling edge) every 500 ps. An output driver of signal path 104 transmits those clock edges off chip. The delay of signal path 104 is the time between a zero crossing of oscillating signal $S_{LC}$ and a corresponding clock edge of output clock signal $CLK_{DRV}$. Note that the delay of signal path 104 may be different for rising edges of output clock signal $CLK_{DRV}$ and falling edges of output clock signal $CLK_{DRV}$.

During transmission of output clock signal $CLK_{DRV}$, a time-varying current flows through the integrated circuit terminals (e.g., pins) and onto an associated printed circuit board. That time-varying current generates a corresponding time-varying electromagnetic field that couples energy into oscillator 102 and causes a periodic phase disturbance. Effects of this coupled energy on oscillator 102 depends on a phase state of oscillator 102 during the time interval of the coupling, the time-varying nature of the signal path output current, and the strength of the coupling between signal path 104 and oscillator 102 as determined by an effective electromagnetic coupling coefficient (i.e., energy per injection) and operating frequency ratio. For example, if the electromagnetic coupling is impulsive and at an energy level much smaller than the energy stored within the oscillator (i.e. small-signal assumption), then each impulse will cause a phase step in a phase trajectory of oscillator 102 according to the phase state at which each impulse occurs. A positive impulse coincident with a rising edge zero crossing or a falling edge zero crossing of oscillating signal $S_{LC}$ causes a corresponding maximum phase step or corresponding minimum phase step, respectively, in oscillating signal $S_{LC}$. However, under ideal conditions, a positive impulse coincident with a maximum peak or a minimum peak of oscillating signal $S_{LC}$ causes no change in the phase trajectory of oscillating signal $S_{LC}$. In other words, the impulse sensitivity function (ISF) of oscillator 102 directly affects the magnitude of the phase disturbance induced by the electromagnetic coupling. The impulse sensitivity function of an oscillator is a periodic function of time that describes the time-varying periodic nature of the oscillator. In general, the ISF is a weighting function that describes the change in the oscillator phase state resulting from a unit current impulse applied to an oscillator node at each phase state in the oscillator cycle. A typical ISF peaks during zero crossings of the oscillating signal and is nearly zero at the peak of the oscillating signal. The ISF of an oscillator may be determined by direct measurement of the oscillator impulse response and calculating the ISF based on the measured impulse response, by an analytical state-space approach that finds an excess phase change caused by an impulse of current from oscillation waveforms, or by approximation techniques based on a first derivative of waveform.

Figure 2:
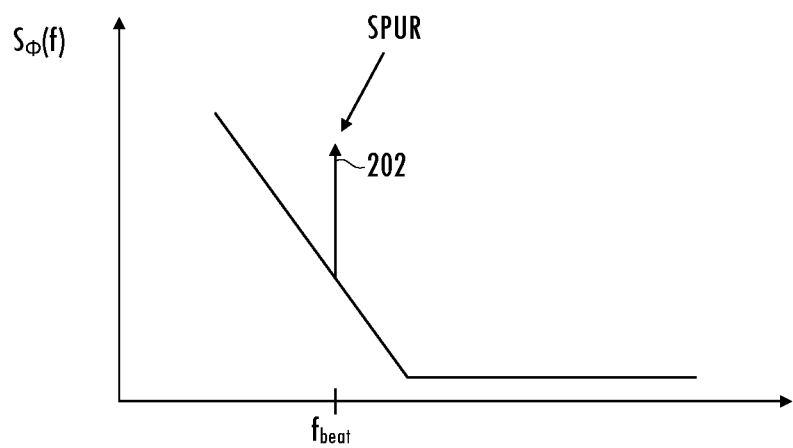
FIG. 2 illustrates phase noise of the oscillator system as a function of frequency with injected deterministic electromagnetic interference.
Figure 3:
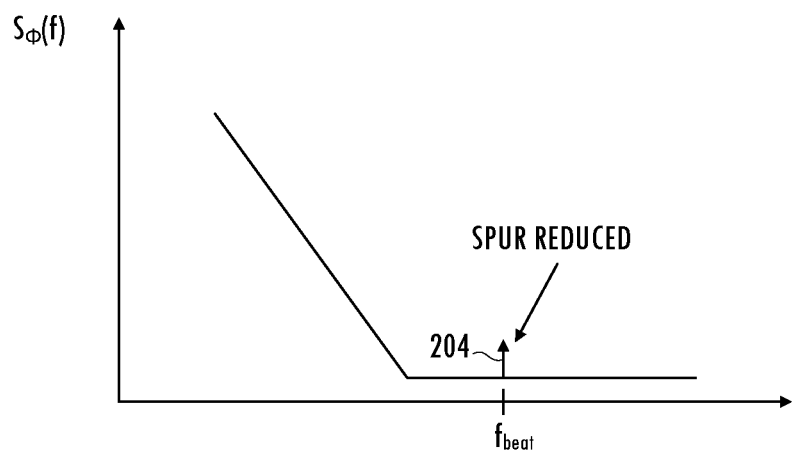
FIG. 3 illustrates phase noise of the oscillator system as a function of frequency with reduced injected deterministic electromagnetic interference.
Figure 4:
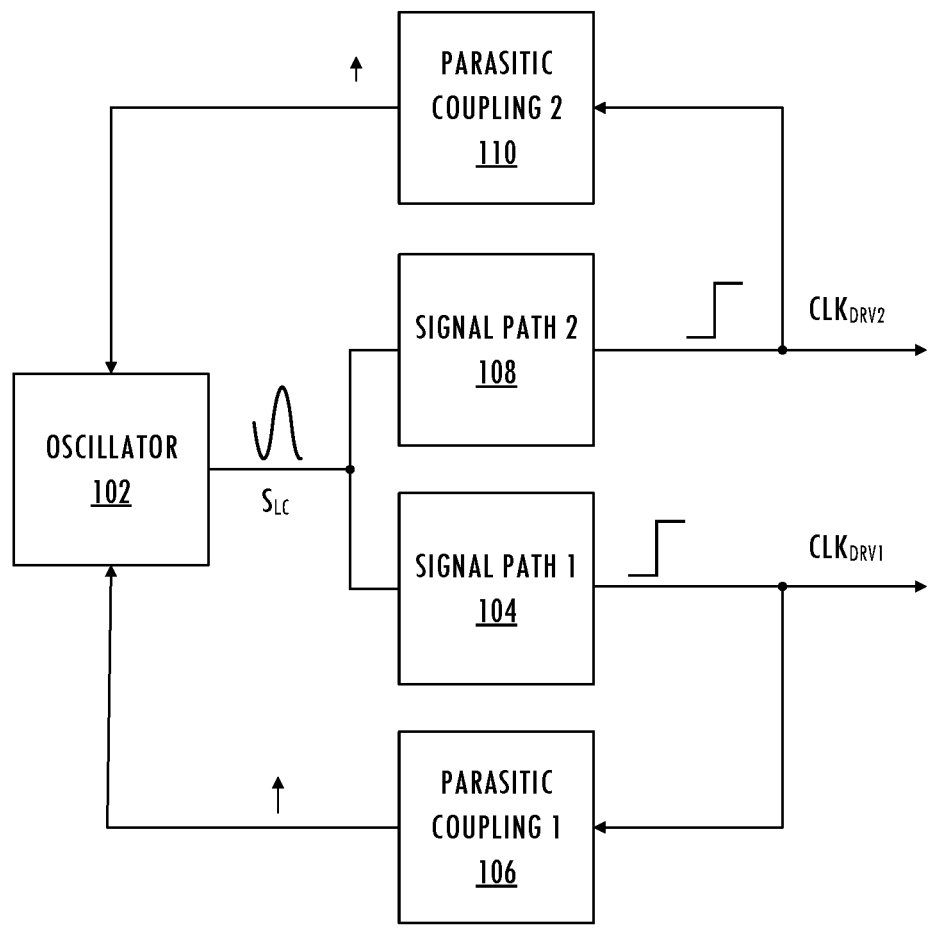
FIG. 4 illustrates a functional block diagram of an exemplary oscillator system including multiple signal paths.

Since the delay of signal path 104 is a function of temperature, which changes very slowly over time, oscillator 102 experiences periodic injections of electromagnetic interference in its phase trajectory (e.g. at its rising edge zero crossing) over an extended interval. Techniques for reducing or eliminating the amount of deterministic electromagnetic interference injected into oscillating signal include reducing the electromagnetic coupling of oscillator 102 and signal path 104 by using physical design techniques that place circuits in locations that reduce electromagnetic coupling (e.g., locations that reduce mutual inductance and mutual capacitance), differential signaling to reduce signal radiation, wave shaping (e.g., slew rate control), and/or system frequency planning to reduce harmonic content close to the frequency of oscillator 102. In addition, increasing the beat frequency may reduce the spur, as illustrated by spur 202 of FIG. 2 and spur 204 of FIG. 3. Offsetting the spur to further remove the spur from the frequency response of oscillator 102 reduces phase accumulation. However, those techniques are limited in some circumstances. For example, the signal format may be limited by interface requirements (e.g., product pin count limitations). System requirements may limit the oscillation frequency of oscillator 102 to target specifications. In addition, multiple coupling paths, as illustrated in FIG. 4, may limit physical design planning. For example, signal path 108 and signal path 104, associated with parasitic coupling 110 and parasitic coupling 106, respectively, may be limited in physical design placement to reduce the effects of process variations in those signal paths.

Figure 5:
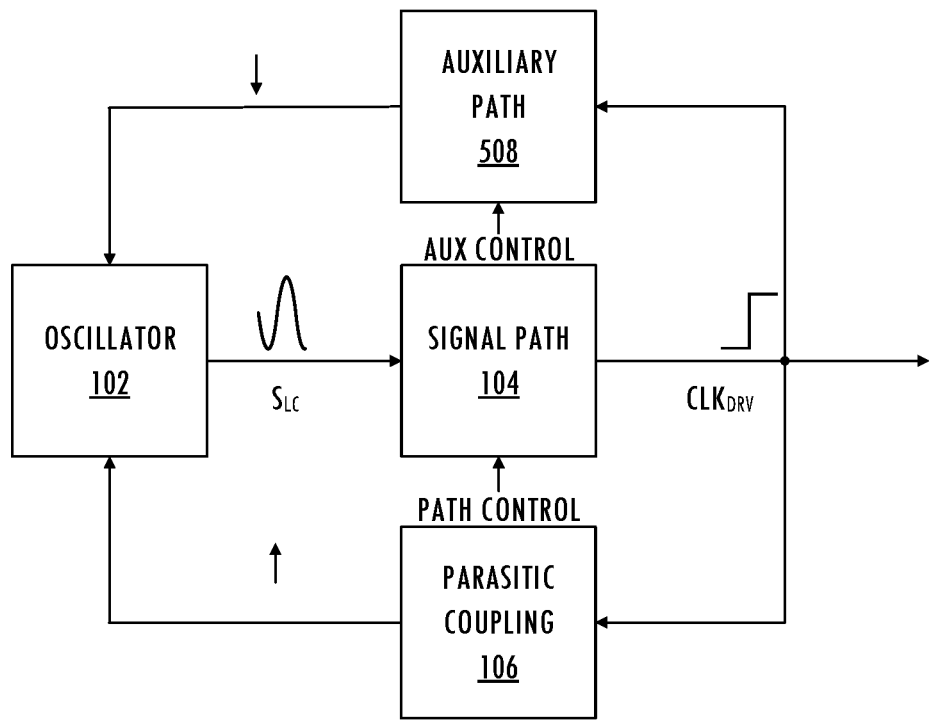
FIG. 5 illustrates a functional block diagram of an oscillator system including auxiliary neutralization of periodic phase perturbations in an exemplary clock synthesizer application consistent with at least one embodiment of the invention.

Referring to FIG. 5, a technique for neutralizing periodic phase perturbations (e.g., parasitic coupling 106) injected into oscillator 502 by controlling auxiliary path 508 in response to an auxiliary control signal or controlling signal path 104 in response to an auxiliary control signal, or a combination thereof. If the delay of signal path 104 is the same for both rising edges and falling edges of output clock signal $CLK_{DRV}$, rising edges and falling edges of output clock signal $CLK_{DRV}$ produce equal but opposite parasitic coupling into oscillator 102 due to the direction of current flow at the output driver pin. If signal path 104 generates output clock signal $CLK_{DRV}$ to have a frequency that is the frequency of oscillating signal $S_{LC}$ divided by an odd integer (e.g., 1, 3, 5, . . . , N), then phase steps resulting from each injection constructively add to cause a frequency offset in oscillating signal $S_{LC}$. However, if signal path 104 generates output clock signal $CLK_{DRV}$ to have a frequency that is the frequency of oscillating signal $S_{LC}$ divided by an even integer (e.g., 2, 4, 6, . . . , N) under the same conditions, then phase steps for each injection destructively combine and generate oscillating signal $S_{LC}$ without a frequency offset, but rather cause duty cycle distortion to output clock signal $CLK_{DRV}$. Equal and opposite phase perturbations cause cancellation of the phase perturbations injected into oscillating signal $S_{LC}$. Thus, if signal path 104 generates output clock signal $CLK_{DRV}$ to have a frequency that is the frequency of oscillating signal $S_{LC}$ divided by a fractional divider relationship (i.e., a frequency of output clock signal $CLK_{DRV}$ being a non-integer division of the frequency of oscillating signal $S_{LC}$) causes a time-varying frequency offset resulting in a spur at an offset frequency in the spectrum of output clock signal $CLK_{DRV}$. The offset frequency is related to the frequency difference between the frequency of oscillating signal $S_{LC}$ and a harmonic of output clock signal $CLK_{DRV}$ that is closest to the frequency of oscillating signal $S_{LC}$.

Figure 7:
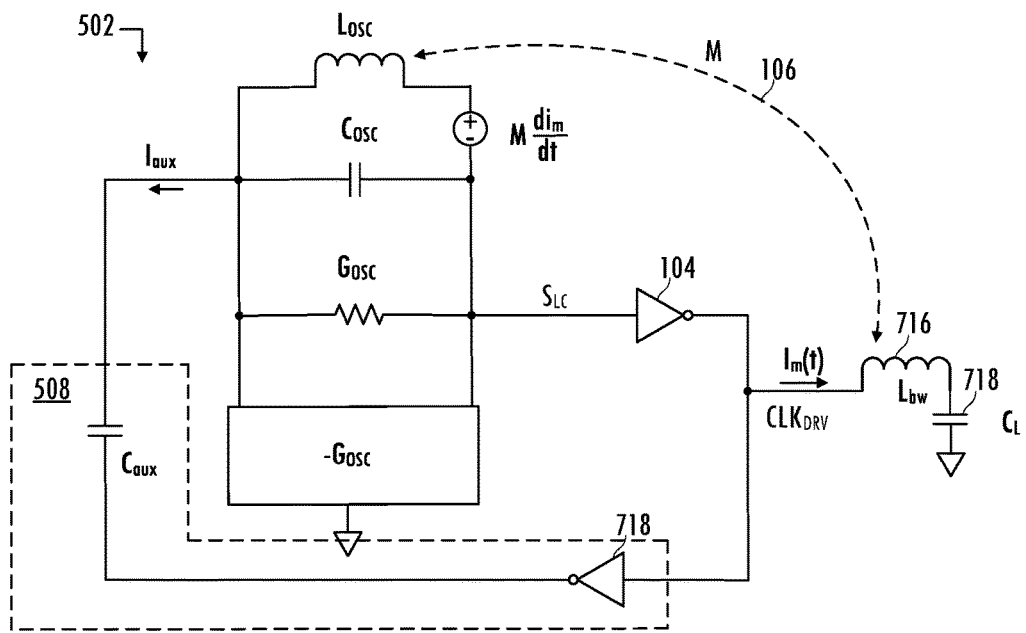
FIG. 7 illustrates a detailed functional block diagram for auxiliary neutralization of periodic phase perturbations consistent with at least one embodiment of the invention.
Figure 8:
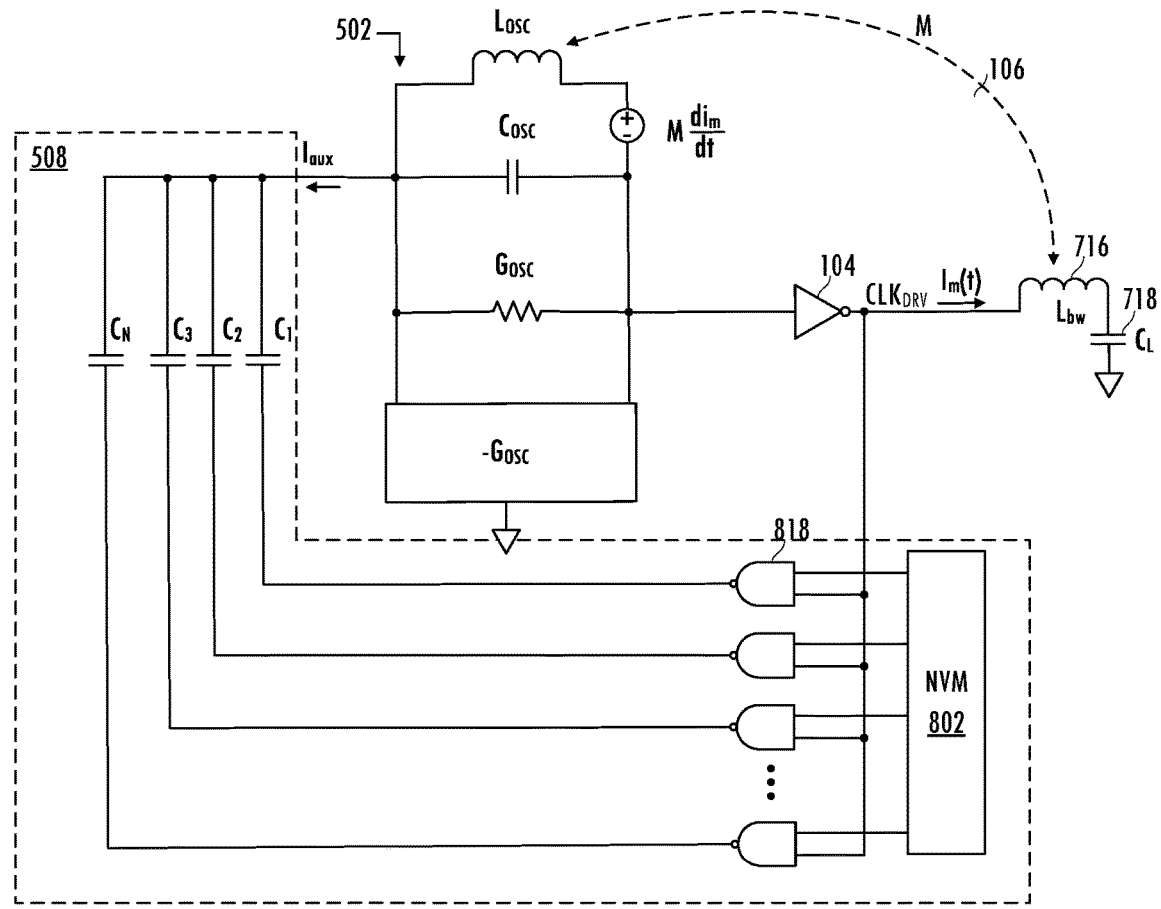
FIG. 8 illustrates a detailed functional block diagram for auxiliary neutralization of periodic phase perturbations consistent with at least one embodiment of the invention.

Referring to FIGS. 5, 7, and 8, auxiliary path 508 neutralizes periodic phase perturbations (i.e., reduces or eliminates effects of the periodic perturbations) of LC oscillator 502 by bond wire 716 (modelled as an inductor). That electromagnetic coupling induces a voltage (e.g., $M \times di_m/dt$) in the tank circuit of LC oscillator 502. Auxiliary path 508 provides auxiliary current $i_{aux}$, that neutralizes the induced voltage. Auxiliary path 508 may be selectively configurable to provide a predetermined amount of neutralization based on a digital control word that is predetermined during characterization of an integrated circuit including oscillator 502 or dynamically updated during operation of oscillator 502 by sensing current induced by the parasitic coupling and converting the current level into a digital control word that corresponds to a magnitude of the induced voltage. The digital control word may be stored in non-volatile memory 802 or other storage device and provided to selectively enable N individual auxiliary paths (e.g., N individual selectable auxiliary paths including corresponding capacitances $C_1, C_2, C_3, \ldots, C_N$, respectively) that provide current $i_{aux}$ to neutralize the induced voltage. In other embodiments, the digital control word may be provided by a digital state machine that generates the digital control word based on predetermined information stored in non-volatile memory 802. In at least one embodiment, a frequency counter coupled to the oscillator determines a frequency of the oscillating signal. Control logic generates the digital control word based on a difference between the frequency and a predetermined nominal frequency value.

In other embodiments, auxiliary path 508 includes one or more selectable transformer structures (e.g., wires with multiple coupling coefficients) instead of N capacitors or in addition to N capacitors, to provide auxiliary current $i_{aux}$ having a signal level that neutralizes the induced voltage. The digital control word used to selectively enable the N individual auxiliary paths may be binary weighted, thermometer coded, or unweighted. In at least one embodiment, the driving devices in auxiliary path 508 (e.g., inverter 718 or NAND gates 818) have variable strengths that can be selected to vary the peak current. Although FIGS. 7 and 8 illustrate auxiliary path 508 using single-ended embodiments, in other embodiments, auxiliary path 508 includes differential circuits. Alternatively, a digital varactor implementing capacitance $C_{OSC}$ in LC oscillator 602 may be adjusted to neutralize the voltage. A portion of the digital varactor may be dedicated to neutralization of periodic phase perturbations due to deterministic electromagnetic interference and another portion dedicated to controlling a predetermined nominal frequency of oscillating signal $S_{LC}$. Auxiliary path 508 provides a degree of freedom for neutralization of injected phase perturbations that is not otherwise available for neutralizing periodic phase perturbations by controlling the signal path alone.

Figure 6:
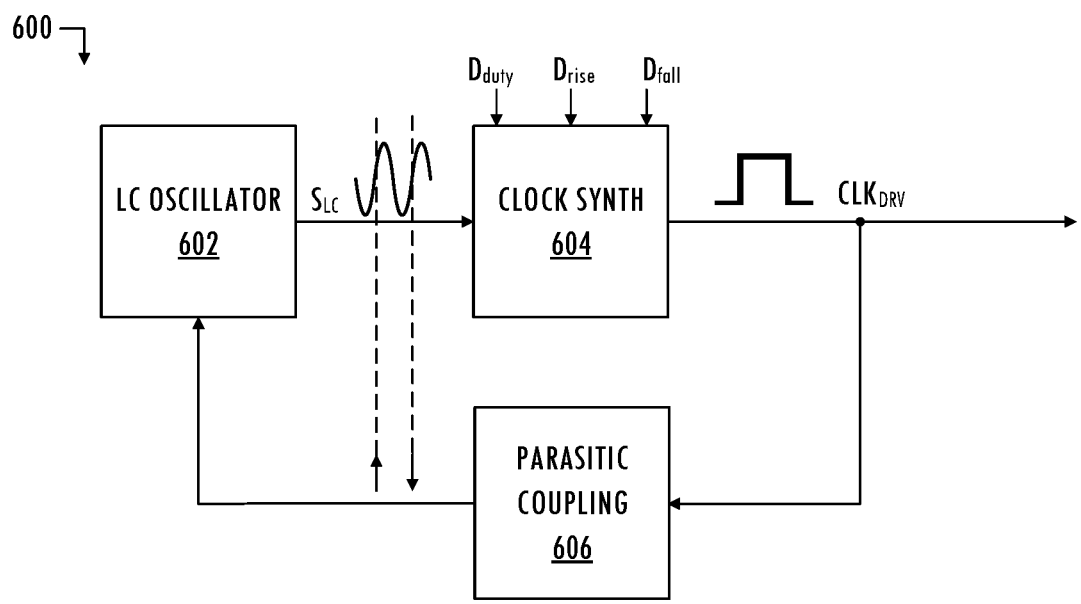
FIG. 6 illustrates a functional block diagram of an oscillator system including integrated neutralization of periodic phase perturbations consistent with at least one embodiment of the invention.

Referring to FIG. 6, in at least one embodiment, clock synthesizer 604 includes one or more clock synthesizer control signals, e.g., $D_{duty}$, $D_{rise}$, and $D_{fall}$ that adjust clock synthesizer 604 to neutralize parasitic coupling 606 that is injected into LC oscillator 602. If clock synthesizer 604 generates output clock signal $CLK_{DRV}$ to have a frequency that is the frequency of oscillating signal $S_{LC}$ divided by an odd integer (e.g., 1, 3, 5, . . . , N), then control signal $D_{duty}$ adjusts the duty cycle of output clock signal $CLK_{DRV}$, to cause rising edges and falling edges of output clock signal $CLK_{DRV}$ to produce equal but opposite phase perturbations from magnetic coupling to LC oscillator 602. Equal and opposite phase perturbations cause cancellation of the phase perturbations injected into oscillating signal $S_{LC}$. If clock synthesizer 604 generates output clock signal $CLK_{DRV}$ to have a frequency that is the frequency of oscillating signal $S_{LC}$ divided by an even integer (e.g., 2, 4, 6, . . . , N), then phase steps for each injection destructively combine and generate oscillating signal $S_{LC}$ without a frequency offset, but rather having duty cycle distortion. Accordingly, when clock synthesizer 604 generates output clock signal $CLK_{DRV}$ to have a frequency that is the frequency of oscillating signal $S_{LC}$ divided by an even integer, $D_{duty}$ is configured to have no effect on the duty cycle of output clock signal $CLK_{DRV}$ (e.g., clock synthesizer 604 ignores $D_{duty}$ or control logic provides a value of $D_{duty}$ that causes no change to the duty cycle) although $D_{rise}$ and $D_{fall}$ may be used to ensure equal (or approximately equal) but opposite phase perturbations. Although unequal, or approximately equal, opposing phase perturbations may not eliminate the effects of the phase perturbations injected into oscillating signal $S_{LC}$ unequal, or approximately equal, opposing phase perturbations will reduce those effects and improve system performance. Clock synthesizer 604 generates output clock signal $CLK_{DRV}$ to have a frequency that is the frequency of oscillating signal $S_{LC}$ divided by a fractional number (i.e., a non-integer divider ratio), which causes a frequency offset resulting in a spur at an offset frequency in the spectrum of output clock signal $CLK_{DRV}$ that is related to the frequency difference between the frequency of oscillating signal $S_{LC}$ and a harmonic of output clock signal $CLK_{DRV}$ that is closest to the frequency of oscillating signal $S_{LC}$.

Referring to FIGS. 6 and 9-14, in at least one embodiment, the electromagnetic coupling of LC oscillator 602 to bond wire 716 that induces a voltage (e.g., $M \times di_m/dt$) in the tank circuit of LC oscillator 602 can be neutralized using duty cycle control applied digitally to clock synthesizer 604, and an auxiliary path (described above) may be omitted. If a rising edge of output clock signal $CLK_{DRV}$ and a next falling edge of output clock signal $CLK_{DRV}$ are spaced apart by an integer number of periods of oscillating signal $S_{LC}$, those edges have the same location on the impulse sensitivity function of oscillating signal $S_{LC}$. However, rising edges of output clock signal $CLK_{DRV}$ cause positive phase perturbations and falling edges of output clock signal $CLK_{DRV}$ cause negative phase perturbations for a given impulse sensitivity of oscillating signal $S_{LC}$. Control signals that adjust the duty cycle, rise time, and fall time of output clock signal $CLK_{DRV}$ neutralize periodic phase perturbations by causing the rising edges of output clock signal $CLK_{DRV}$ and the falling edges of output clock signal $CLK_{DRV}$ to fall on equal locations of the impulse sensitivity function of oscillating signal $S_{LC}$.

For example, digital word $N_{DC}.F_{DC}$, which has integer portion $N_{DC}$ and fractional portion $F_{DC}$, applies duty cycle adjustment $D_{duty}$ to output clock signal $CLK_{DRV}$ relative to a 50% duty cycle. Output divider 906 provides polarity control signal pol to cause interpolative divider 904 to apply an inverted version of digital word $N_{DC}.F_{DC}$. The polarity control signal pol and digital word $N_{DC}.F_{DC}$, which change the duty cycle, cause interpolative divider 904 to apply a net frequency division to the signal that depends only on fractional frequency divider code $N_{ID}.F_{ID}$. Output divider 906 applies a frequency division (e.g., $2 \times N_{OD}$) to reduce distortion of the duty cycle output clock signal $CLK_{DRV}$ from a predetermined duty cycle (e.g., 50% duty cycle). As a result, interpolative divider 904 increases the high dwell time of clock signal $CLK_{ID}$ by $N_{DC}.F_{DC}$ and decreases the low dwell time of clock signal $CLK_{ID}$ by $N_{DC}.F_{DC}$, which implement the duty cycle adjustment, but cause a zero net frequency change based on digital word $N_{DC}.F_{DC}$. Control signal $D_{rise}$ and control signal $D_{fall}$ configure pull-up circuit 910 and pull-down circuit 912, respectively, to implement equal rise times and fall times of output clock signal $CLK_{DRV}$ corresponding to equal but opposite phase perturbations for optimal cancellation. Pull-up circuit 910 may include selectively enabled PMOS devices coupled in parallel and pull-down circuit 912 may include selectively enabled NMOS devices coupled in parallel to adjust the slew rate of output clock signal $CLK_{DRV}$. Adjusting the rise time and the fall time increases symmetry of the perturbations to facilitate neutralization using opposing phase perturbations to implement the duty cycle adjustment with zero net frequency change.

Figure 11:
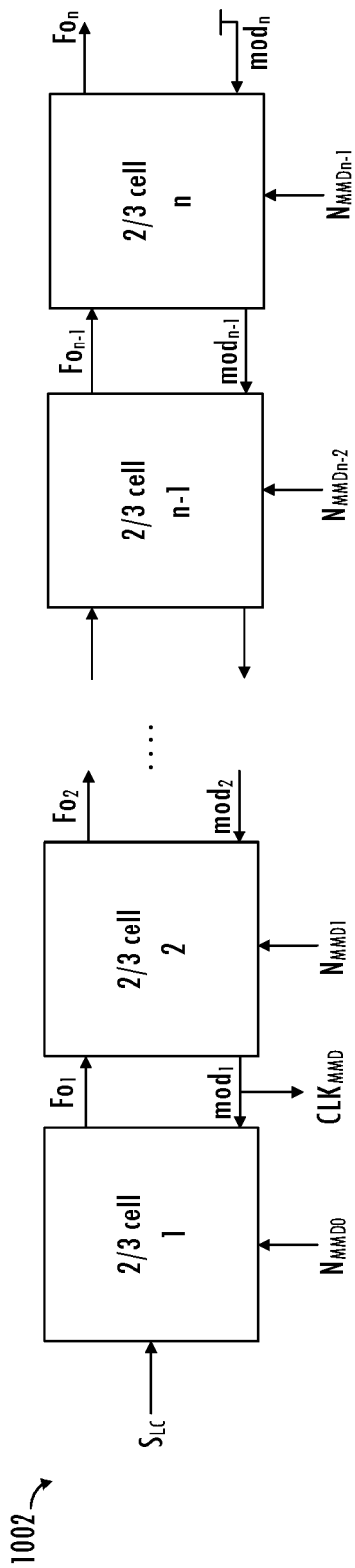
FIG. 11 illustrates a functional block diagram for an exemplary multi-modulus divider of the interpolative divider of FIG. 10 consistent with at least one embodiment of the invention.

In at least one embodiment, interpolative divider 904 is a low-noise fractional frequency divider that includes multi-modulus divider 1002 responsive to digital control word $N_{MMD}$ that dithers between divider values to implement fractional frequency division. FIG. 11 illustrates an exemplary embodiment of multi-modulus divider 1002 that includes an integer number of ⅔ frequency divider cells coupled in series. Cell n generates the signal $mode_{n-1}$ once per division period. That signal propagates through the chain of cells. Each cell re-clocks the propagating signal. An active mod signal enables a corresponding cell to frequency divide by three once per division period, in response to a corresponding bit of $N_{MMD}$ being active. Each division by three adds one extra period of the input signal of each cell to the period of the output signal. The chain of cells provides clock signal $CLK_{MMD}$ with period $P_{MMD}$ in relation to the input period $P_{LC}$ of $S_{LC}$ as follows:

$$P_{MMD}=P_{LC}\times[2^n+N_{MMDn-1}\times 2^{n-1}+\ldots+N_{MMDn-2}\times 2^{n-2}+\ldots+N_{MMD1}\times 2^1+N_{MMD0}\times 2^0].$$

Figure 9:
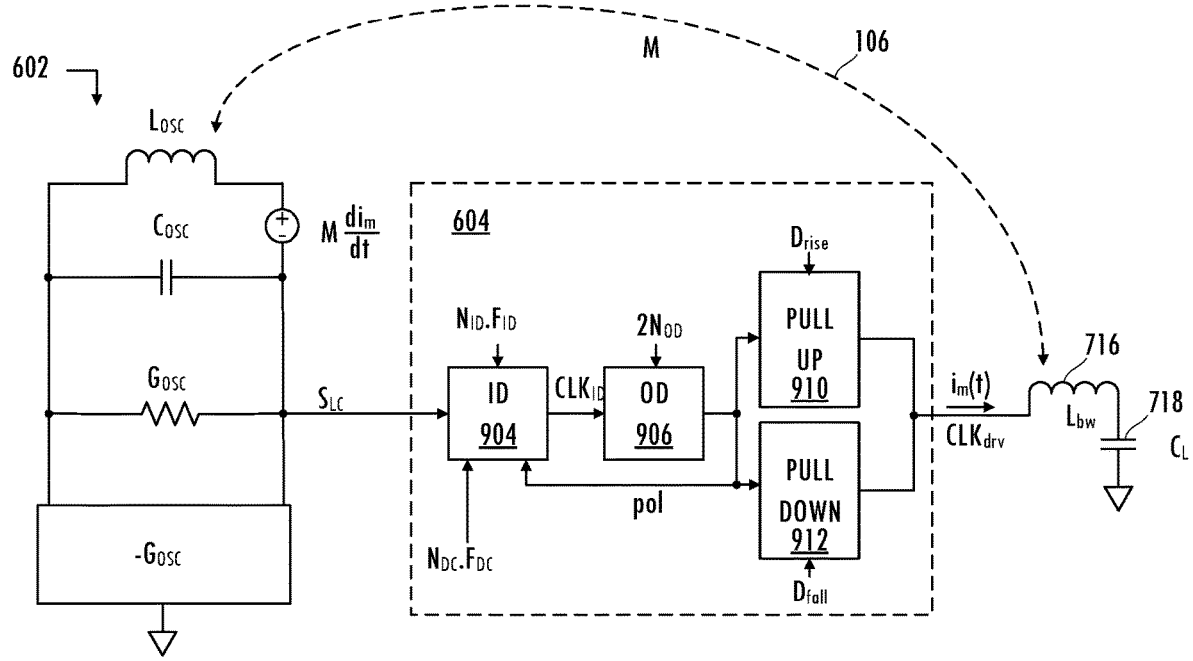
FIG. 9 illustrates a detailed functional block diagram for duty-cycle based neutralization of periodic phase perturbations consistent with at least one embodiment of the invention.
Figure 10:
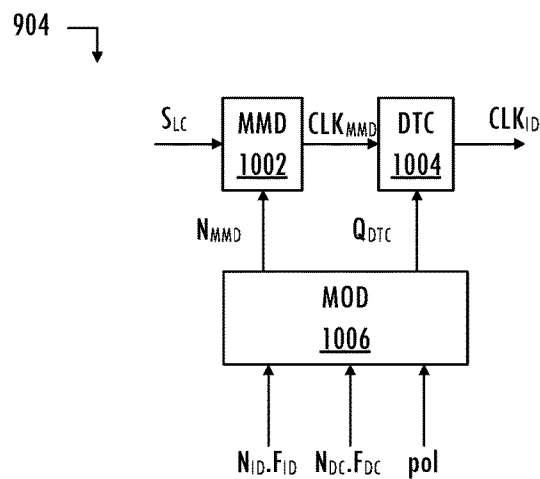
FIG. 10 illustrates a functional block diagram for an exemplary interpolative divider of FIG. 9 consistent with at least one embodiment of the invention.
Figure 12:
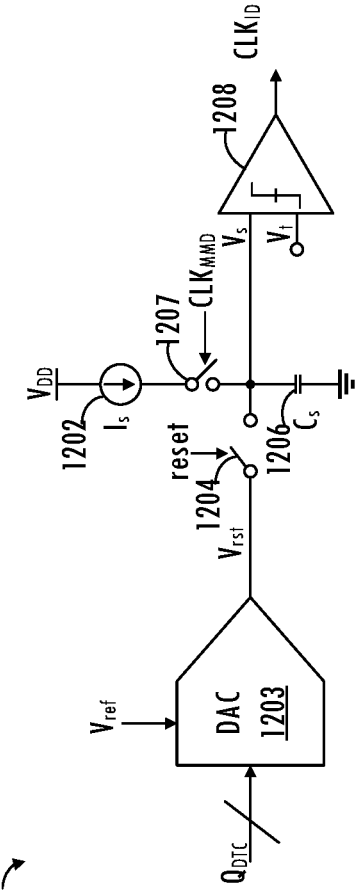
FIG. 12 illustrates a functional block diagram for an exemplary digital-to-time converter of the interpolative divider of FIG. 10 consistent with at least one embodiment of the invention.
Figure 13:
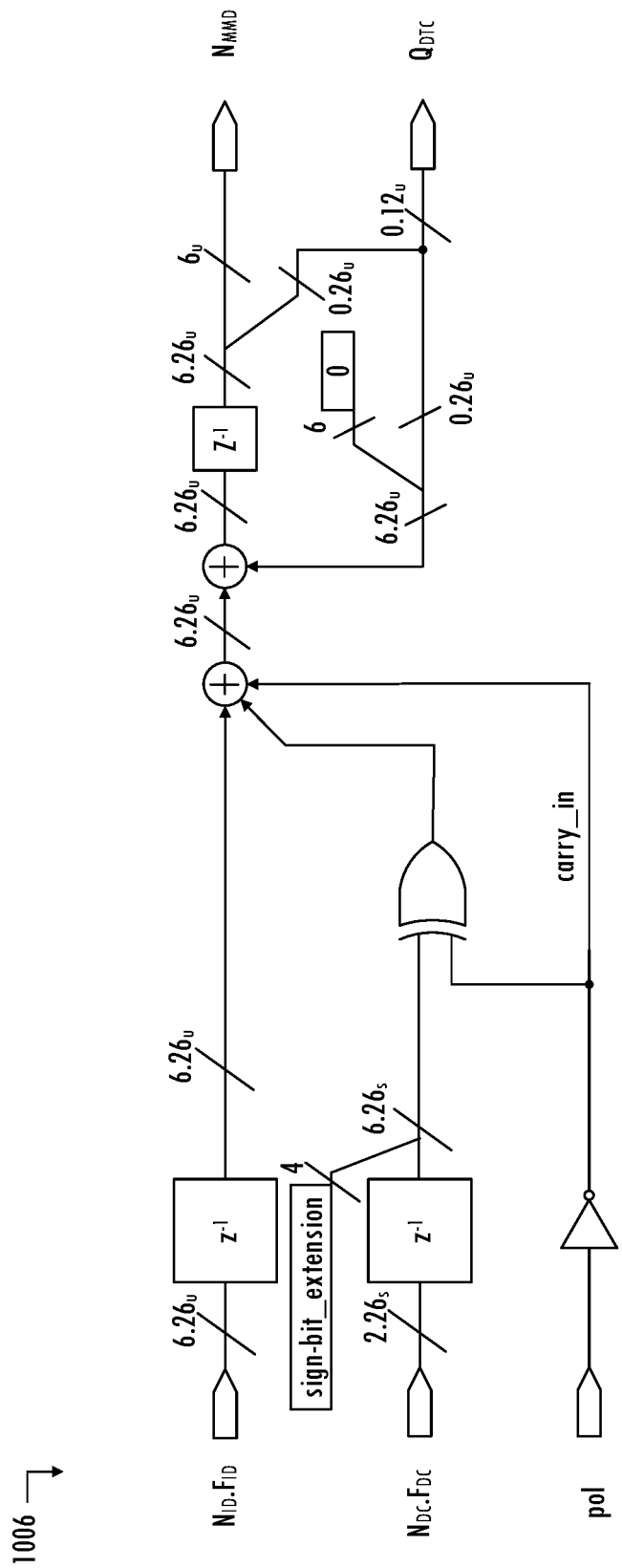
FIG. 13 illustrates a functional block diagram for an exemplary modulator of the interpolative divider of FIG. 10 consistent with at least one embodiment of the invention.

Referring to FIGS. 6, 9, and 10, multi-modulus divider 1002 is coupled in series with digital-to-time converter 1004, which is responsive to digital control word $Q_{DTC}$ to reduce or eliminate quantization noise introduced by multi-modulus divider 1002. FIG. 12 illustrates an exemplary embodiment of digital-to-time converter 1004. Digital-to-time converter 1004 includes constant current source 1202, which provides constant current Is, and predetermined capacitor 1206, which provides constant capacitance Cs. Digital-to-time converter 1004 is configured to generate a selectively controllable reset voltage, $V_{rst}$ based on digital control word $Q_{DTC}$ and reference voltage $V_{ref}$. During a first time interval, e.g., the time interval during which the reset control signal closes switch 1204 and evaluate control signal $CLK_{MMD}$ opens switch 1207, digital-to-time converter 1004 applies reset voltage $V_{rst}$ to charge fixed capacitor Cs to a level determined according to a particular reset voltage level selected based on digital control word $Q_{DTC}$. During a second time interval, switch 1204 is open according to the reset control signal and switch 1207 is closed according to clock signal $CLK_{MMD}$. Digital-to-time converter 1004 applies the constant current generated by current source 1202 to node $V_s$, causing the voltage level on node $V_s$ to increase from the selected reset voltage level to a second level, $V_c$, with linear delay control. Digital-to-analog converter 1203 of digital-to-time converter 1002 may include passive elements (e.g., resistors and capacitors) that are easily matched by manufacturing techniques. Digital-to-time converter 1002 includes comparator 1208, which generates clock signal $CLK_{ID}$ based on predetermined threshold voltage $V_t$ and the voltage level on node $V_s$.

Referring to FIGS. 6, 9, 10, and 13, modulator 1006 generates digital control word $N_{MMD}$ (e.g., 6 unsigned integer bits) and digital control word $Q_{DTC}$ (e.g., 12 unsigned fractional bits) based on fractional divider code $N_{ID}.F_{ID}$ (e.g., $N_{ID}.F_{ID}=6.26$, $N_{ID}=6$ unsigned integer bits, $F_{ID}=26$ unsigned, fractional bits). Modulator 1006 sets the duty cycle of clock signal $CLK_{ID}$ based on digital word $N_{DC}.F_{DC}$ (e.g., e.g., $N_{DC}.F_{DC}=2.26_s$, $N_{DC}=2$ signed integer bits, $F_{DC}=26$ signed, fractional bits) and control signal pol, as described functionally above. For example, modulator 1006 is a first order modulator with duty cycle control, although higher order modulators with duty cycle control may be used. If the deterministic phase perturbations introduced by parasitic coupling 106 to the oscillator are symmetric, maximum neutralization of the electromagnetic coupling occurs in response to rising edges of output clock signal $CLK_{DRV}$ being spaced an integer number apart of periods of oscillating signal $S_{LC}$. Accordingly, an ideal number of oscillator periods occur between rising output driver edges and corresponding falling output driver edges when operating at 50% duty cycle for control word $N_{rf}.F_{rf}$ which has a value determined as $N_{rf}.F_{rf}=N_{ID}.F_{ID}*N_{OD}$. Control word $N_{DC}.F_{DC}$ may be determined as $N_{DC}.F_{DC}=[\text{Round}(0.F_{rf})-0.F_{rf}+N_{DC0}.F_{DC0}]/N_{OD}$ (i.e. the minimum duty cycle modulation required to space output driver rising edges precisely an integer number of oscillator periods away from output driver falling edges), where $N_{DC0}.F_{DC0}$ is a predetermined value that adjusts for duty cycle mismatch that is intrinsic to the signal path and may be determined during production test or characterization. Note that after determining $N_{DC0}.F_{DC0}$, a digital state machine may determine a value of digital word $N_{DC}.F_{DC}$ that provides target (e.g., optimal) duty cycle adjustment based on fractional frequency divider code $N_{ID}.F_{ID}$ and output divider code $N_{OD}$. Accordingly, only $N_{DC0}.F_{DC0}$ is stored in non-volatile memory.

Figure 14:
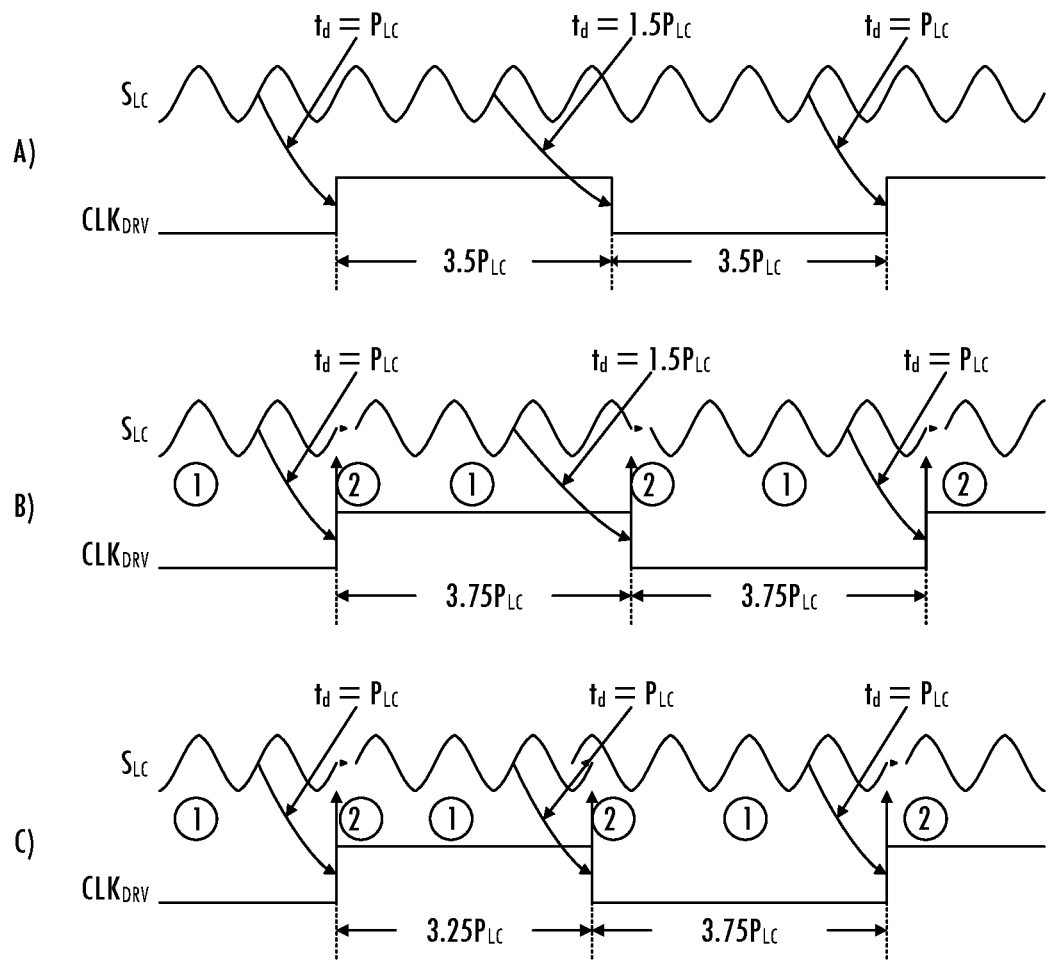
FIG. 14 illustrates exemplary waveforms for duty-cycle based neutralization of periodic phase perturbations consistent with at least one embodiment of the invention.

FIG. 14 illustrates duty-cycle based neutralization for exemplary frequency divider value DIV=7. Without any electromagnetic coupling (FIG. 14A), output clock signal $CLK_{DRV}$ has a duty cycle that alternates by $0.5 \times P_{LC}$, where $P_{LC}$ is the period of oscillating signal $S_{LC}$ generated by oscillator 602. In an extreme case of electromagnetic coupling (FIG. 14B), a beat frequency of 0 Hz causes frequency pulling instead of a spur. For example, that frequency pulling results in an effective frequency divider value of 7.5. A high resolution (e.g., 15 parts per billion) frequency counter, which may be included on-chip or off-chip, may be used to identify a worst-case frequency pulling condition and to determine a value that may be used to pull the frequency back to a predetermined nominal frequency. That value may be stored and used in a neutralization mode for reduction or elimination of a spur. The rising edge of output clock signal $CLK_{DRV}$ has a $+0.25 \times P_{LC}$ phase perturbation and the falling edge of output clock signal $CLK_{DRV}$ has a $+0.25 \times P_{LC}$ phase perturbation. Duty-cycle based neutralization (FIG. 14C) forces an integer number of cycles of oscillating clock signal $S_{LC}$ between output edges and causes equal, but opposite phase perturbations. However, the resulting duty cycle distortion must be budgeted by the intended application. Note that FIG. 14 illustrates extreme coupling between output clock signal $CLK_{DRV}$ and oscillator 602 causing an oscillator phase shift of one quarter of the period of oscillating signal $S_{LC}$. In an exemplary application, the phase shift is substantially less, e.g., less than 1/1000 of the period of oscillating signal $S_{LC}$ (e.g., the phase shift is less than 1 ps for oscillating signal $S_{LC}$ having a 1 ns period at a frequency of 1 GHz).

Referring to FIG. 6, in an exemplary clock synthesizer application, oscillator 602 drives additional channels of clock synthesizer paths 604 (not shown). Those additional clock synthesizer paths 604 have corresponding parasitic coupling paths. Independent control signals may be used to neutralize periodic phase perturbations with corresponding $N_{DC}.F_{DC}$ values stored in non-volatile memory and determined during characterization or production test of each channel. To increase system flexibility and reduce non-volatile memory storage, non-volatile memory stores a predetermined value of $N_{DC0}.F_{DC0}$ for each channel, and an on-chip digital state machine determines the target values of digital word $N_{DC}.F_{DC}$ for each corresponding divider configuration. The duty cycle of each output clock signal $CLK_{DRV}$ output from corresponding clock synthesizer path 604 may be separately tuned for neutralization. However, note that in some applications, tuning the rising edges and falling edges of output clock signal $CLK_{DRV}$ to coincide with equal locations of the oscillator impulse sensitivity function introduces duty cycle error in output clock signal $CLK_{DRV}$, which may not be tolerated in some applications and the auxiliary path techniques, described above, should be used. In applications that require a predetermined (e.g., 50%) duty cycle, auxiliary path 508, as illustrated in FIG. 5, is used instead of duty-cycle neutralization techniques described above. The auxiliary path provides a degree of freedom for neutralization of injected phase perturbations that is not otherwise available by controlling the signal path alone.

Thus, techniques for neutralizing periodic phase perturbations injected into an oscillator system have been described. The techniques are independent of system requirements and are scalable to multiple independent channels. The description of the invention set forth herein is illustrative and is not intended to limit the scope of the invention as set forth in the following claims. For example, while the invention has been described in an embodiment in which the oscillator is a free-running LC oscillator, one of skill in the art will appreciate that the teachings herein can be utilized with other oscillator types (e.g., crystal oscillator systems having an amplifier that has electromagnetic coupling from bond wires coupled to an external crystal) or oscillators included in closed-loop systems (e.g., a phase-locked loop) to obtain cancellation that is independent of the system feedback loop. Variations and modifications of the embodiments disclosed herein, may be made based on the description set forth herein, without departing from the scope of the invention as set forth in the following claims.

What is claimed is:

1. A clock generator comprising:
    an oscillator configured to generate an oscillating signal; and
    a signal path coupled to the oscillator and configured to provide an output clock signal based on the oscillating signal, the signal path comprising a frequency divider configured to generate the output clock signal having an output frequency, a ratio of the output frequency and a first frequency of the oscillating signal being a fractional number,
    wherein in response to a control signal, the signal path is configured to neutralize periodic phase perturbations in the oscillating signal using opposing periodic phase perturbations.

2. The clock generator, as recited in claim 1, wherein the signal path is responsive to the control signal to adjust a duty cycle, a rise time, or a fall time of the output clock signal to cause alternating phase perturbations of the periodic phase perturbations to apply as the opposing periodic phase perturbations in the output clock signal.

3. The clock generator, as recited in claim 1, wherein the control signal is configured to adjust a duty cycle of the output clock signal to cause an integer number of periods of the oscillating signal to occur between a rising edge of the output clock signal and a next falling edge of the output clock signal.

4. The clock generator, as recited in claim 1, wherein the frequency divider comprises:
    an interpolative divider responsive to a fractional divider value, a fractional duty cycle adjustment value, and an indication of a polarity of the output clock signal, the interpolative divider being configured to implement a duty cycle adjustment based on the fractional duty cycle adjustment value with a zero net frequency change from a frequency indicated by the fractional divider value.

5. The clock generator, as recited in claim 4, wherein the fractional duty cycle adjustment value configures the interpolative divider to adjust rising edges of the output clock signal and falling edges of the output clock signal to coincide with equal locations of an impulse sensitivity function of the oscillating signal.

6. The clock generator, as recited in claim 4, wherein the signal path further comprises:
    a pull-up circuit responsive to a rise time control signal; and
    a pull-down circuit responsive to a fall time control signal,
    wherein the pull-up circuit and the pull-down circuit are configured to cause a rise time of the output clock signal and a fall time of the output clock signal to provide a predetermined amount of neutralization.

7. The clock generator, as recited in claim 1, wherein the periodic phase perturbations are injected into the oscillating signal by deterministic electromagnetic interference.

8. The clock generator, as recited in claim 1, wherein the oscillator is a free-running oscillator.

9. The clock generator, as recited in claim 1, further comprising:
    an additional signal path configured to generate an additional output clock signal in response to the oscillating signal,
    the additional signal path being responsive to an additional control signal to adjust a duty cycle, a rise time, or a fall time of the additional output clock signal to cause alternating phase perturbations of the periodic phase perturbations to apply opposing phase perturbations to the additional output clock signal.

10. A clock generator comprising:
    an oscillator configured to generate an oscillating signal, the oscillator comprising a tank circuit configured to oscillate at a nominal frequency;
    a signal path configured to provide an output clock signal based on the oscillating signal;

an auxiliary path configured to provide an auxiliary signal to the oscillator, the auxiliary signal being based on the oscillating signal and configured according to a control signal to generate a signal having a magnitude equal to a second magnitude of an induced signal in the oscillator and a polarity opposite to a second polarity of the induced signal, the auxiliary path comprising a selectable capacitance circuit or a selectable inductor circuit responsive to the control signal to provide the auxiliary signal to the tank circuit, wherein in response to the control signal, the clock generator is configured to neutralize periodic phase perturbations in the oscillating signal using opposing periodic phase perturbations, wherein the clock generator is configured to use the opposing periodic phase perturbations in the oscillator.

11. The clock generator, as recited in claim 10, wherein the auxiliary path comprises the selectable capacitance circuit responsive to the control signal to provide the auxiliary signal to the tank circuit.

12. A method for reducing jitter in an output clock signal of a clock generator, the method comprising:

generating an oscillating signal; and providing the output clock signal in response to generation of the oscillating signal, wherein providing the output clock signal comprises:

generating the output clock signal having an output frequency that is a first frequency of the oscillating signal divided by a fractional number; and in response to a control signal, neutralizing periodic phase perturbations in the oscillating signal using opposing periodic phase perturbations, the neutralizing comprising adjusting a duty cycle of the output clock signal to cause an integer number of periods of the oscillating signal to occur between a rising edge of the output clock signal and a next falling edge of the output clock signal.

13. The method, as recited in claim 12, wherein the neutralizing:

causes alternating phase perturbations of the periodic phase perturbations to apply opposing phase perturbations to the output clock signal.

14. The method, as recited in claim 13, wherein the neutralizing further comprises:

adjusting a rise time of the output clock signal or a fall time of the output clock signal to cause the rise time and the fall time to provide a predetermined amount of neutralization.

15. The method, as recited in claim 12, wherein the neutralizing:

causes rising edges of the output clock signal and falling edges of the output clock signal to coincide with equal locations of an impulse sensitivity function of the oscillating signal.

16. The method, as recited in claim 12, wherein the neutralizing implements the duty cycle of the output clock signal based on a fractional duty-cycle adjustment value with a zero net frequency change from a frequency indicated by a fractional divider value provided to generate the output clock signal.

* * * * *